United States Patent [19]

Vernon

[11] Patent Number: 5,339,078
[45] Date of Patent: Aug. 16, 1994

[54] DIGITAL TO ANALOG CONVERTER SWITCH CIRCUIT

[75] Inventor: Scott D. Vernon, San Diego, Calif.

[73] Assignee: Raytheon Company, Lexington, Mass.

[21] Appl. No.: 90,603

[22] Filed: Jul. 12, 1993

[51] Int. Cl.$^5$ .............................................. H03M 1/66
[52] U.S. Cl. ..................................... 341/136; 307/571
[58] Field of Search ................. 341/136, 144; 307/263, 307/571, 572, 576

[56] References Cited

U.S. PATENT DOCUMENTS

| | | | |
|---|---|---|---|
| 4,831,282 | 5/1989 | Colles | 307/443 |
| 5,184,129 | 2/1993 | Fung et al. | 341/144 |
| 5,258,757 | 11/1993 | Reynolds | 341/136 |

*Primary Examiner*—Marc S. Hoff
*Attorney, Agent, or Firm*—William R. Clark; Richard M. Sharkansky

[57] ABSTRACT

A digital-to-analog converter switch provides substantially equal propagation delays for both high-to-low and low-to-high transitions of the binary input signal. A ground path transistor and an output transistor are connected to a common node and operated in different states of conduction as determined by the gate voltage on the ground path transistor. A substantially constant current is fed to the node and is either switched through the output transistor or the ground path transistor. In order to compensate for unequal propagation delays in switching the current on and off through the output transistor, additional mimic transistors are provided between the binary input signal and the gate of the ground path transistor. Therefore, transitions in both directions involve one fast and one short propagation delay.

18 Claims, 4 Drawing Sheets

DIGITAL TO ANALOG CONVERTER SWITCH CIRCUIT

BACKGROUND OF THE INVENTION

The field of the invention generally relates to digital-to-analog converters (DACs), and more particularly relates to switched-current-type DACs that generate waveforms of precision amplitude and timing.

As is well known, digital-to-analog converters generate analog signals representative of digital inputs. One type of digital-to-analog converter is commonly referred to as a switched-current-type. That is, a substantially constant current is generated, and the current is switched either to the output or to ground, depending on the state of the digital input. The use of current allows the outputs of many switches to be added by simply tying their outputs together. The resulting summed current can then be converted into a voltage by providing a load resistor.

Switched-current-type DACs are commonly used for high speed applications such as applications having clock rates of 5 MHz and above. One example of a high speed application is an integrated circuit where digital-to-analog converters are used to generate analog versions of output signals which are computed by on-chip digital circuitry. Another example is a phase locked loop which requires a precision sine wave at one point in the process.

In one prior art switched-current-type DAC, a current providing transistor supplies a substantially constant current to a node that branches to an output transistor and a ground path transistor. In particular, the current providing transistor is a p-type with a drain terminal connected to the node; the output transistor is a p-type with a source terminal connected to the node; and the ground path transistor is an n-type with a drain terminal connected to the node. The digital input is supplied to the gate of the ground path transistor, and determines its state of conduction. The state of conduction of the output transistor is opposite the state of conduction of the ground path transistor. Therefore, depending on the digital input, the substantially constant current is either switched to ground, or alternatively switched to the output of the output transistor.

One drawback of the above described arrangement is that it may generate harmonic distortion. One cause of the distortion results from the switching on of current having a different propagation delay than the switching off of current. In particular, the ground path transistor operates in its linear region. Thus, when the digital input goes high, it can rapidly discharge any capacitance at the node resulting in a very short propagation delay in switching off the output current. However, when the digital input goes low, the capacitance at the node is charged by the current providing transistor which operates in its saturation region. Therefore, the current provided by the current providing transistor is relatively small resulting in a slow charging of the node. Further, the output transistor will not begin to conduct until the node reaches approximately 1 volt above its gate bias voltage. Thus, as compared with the rapid switching off of current after the digital input goes high, the switching on of current has a relatively long propagation delay. The problem of unequal delays between switching on and switching off current can be illustrated by the use of a digital input square wave to generate a precision analog square wave. Rather than obtaining an analog representation of the square wave, an anomalous waveform is generated thereby leading to harmonic distortion.

Another cause of harmonic distortion can arise due to differences in rise and fall times. These output rise and fall times are dependent on the rate at which the output transistor switches from on to off, and vice versa. These switching rates are in turn dependent on the slew rates of the node as the voltage passes through the critical point where the output transistor changes state. The slew rate of the above described arrangement is steeper on the falling edge than on the rising edge. Thus, the output has a quicker fall time than rise time which contributes to harmonic distortion.

SUMMARY OF THE INVENTION

In accordance with the invention, a circuit provides an output current having characteristics indicating a binary input voltage having a first characteristic representing a binary "1" and a second characteristic representing a binary "0". The circuit comprises means for generating a substantially constant current, and switching means responsive to a switching signal for either feeding the substantially constant current as output current to an output terminal or diverting the current in accordance with the switching signal. The switching means has a first propagation delay for switching on current to the output terminal and a second propagation delay for switching off current to the output terminal wherein the first and second propagation delays are unequal. The circuit further comprises means responsive to the binary input voltage for providing the switching signal to the switching means wherein the providing means has unequal propagation delays for a binary input voltage transition from a "1" to a "0" than for a transition from a "0" to a "1" to compensate for the first and second propagation delays being unequal. In particular, a propagation delay from a first one of the binary input voltage transitions to a corresponding switching on or switching off of the substantially constant current to the output terminal is made substantially equal to a propagation delay from the opposite one of the binary input voltage transitions to a corresponding switching on or switching off of the substantially constant current to the output terminal. Each type of transition (i.e. from low-to-high or high-to-low) involves one relatively slow and one relatively fast propagation delay.

Preferably, the substantially constant current generating means comprises an MOS transistor having a predetermined energizing voltage and a gate coupled to a substantially constant reference voltage. The switching means may comprise first and second MOS transistors connected to a common node with the transistor generating the substantially constant current wherein the first transistor is coupled between the node and ground, and the second transistor is coupled between the node and the output terminal. In such arrangement, the first and second transistors are in opposite states of conduction with the conduction state of the first transistor being determined by the switching signal wherein the substantially constant current is directed either through the second transistor to the output terminal or through the first transistor to ground in accordance with the switching signal.

The switching signal providing means preferably comprises fourth and fifth MOS transistors wherein the fourth transistor has the same energizing voltage and gate voltage as the transistor generating the substantially constant current to generate a second current fed to a second node, and the fifth transistor is coupled between the second node and ground with the gate of the fifth transistor being fed by the binary input voltage. The second node is preferably coupled to the gate of the first transistor to provide the switching signal.

With such arrangement, a short delay is added to the long delay of the switch, and a long delay is added to the short delay. Therefore, the total propagation delays for both high-to-low and low-to-high transitions and their corresponding switching on and switching off of current are substantially equal. Thus, the output switching is precisely timed to the input transitions, and a precision analog signal is provided. As a result, harmonic distortion due to unequal propagation delays is greatly reduced. Further, the addition of the fourth and fifth transistors and the relatively slow node for high-to-low transitions provides substantially equal slew rates at the switch node for both high-to-low and low-to-high transitions. Thus, the output has substantially equal rise and fall times, thereby improving another cause of harmonic distortion.

BRIEF DESCRIPTION OF THE DRAWINGS

The foregoing objects and advantages will be more fully understood by reading and following description of the preferred embodiment with reference to the drawings wherein.

DESCRIPTION OF THE PREFERRED EMBODIMENT

Figure 1:
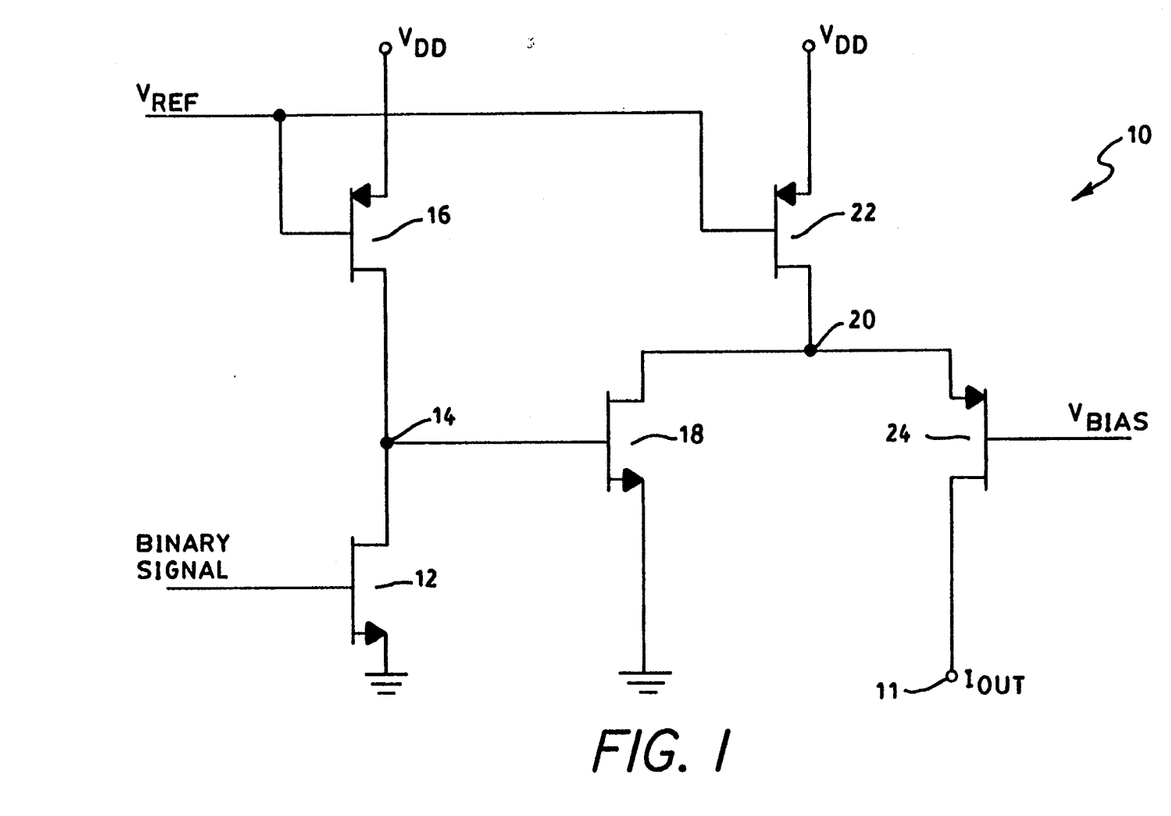
FIG. 1 is a schematic of a switch circuit for a digital-to-analog converter.

Referring to FIG. 1, a circuit 10 is adapted for receiving a binary input signal such as a bit of a digital word, and producing at output terminal 11 an output current $I_{OUT}$ representative of the state of the binary input signal. In particular, the binary input signal is coupled to the gate of MOS transistor 12, here shown as an n-type. The source of transistor 12 is coupled to ground while the drain is connected to node 14 and the drain of MOS transistor 16, here shown as a p-type. The source of transistor 16 is coupled to an energizing voltage $V_{DD}$ such as, for example +5 volts. The gate of transistor 16 is coupled to a substantially constant reference voltage $V_{REF}$.

Node 14 is also connected to the gate of MOS transistor 18, here shown as an n-type. The source of transistor 18 is coupled to ground while the drain is coupled to node 20. Node 20 is also connected to the drain of MOS transistor 22, here shown as a p-type. Like transistor 16, the gate of transistor 22 is connected to $V_{REF}$ and the source is connected to $V_{DD}$. Further, node 20 is connected to the source of MOS transistor 24, here a p-type. The gate of transistor 24 is connected to $V_{BIAS}$, while the drain is connected to the output terminal 11 and provides the output current $I_{OUT}$.

In operation, transistor 22 functions as a substantially constant current producing device. In particular, transistor 22 feeds a substantially constant current of predetermined value to node 20. The value or magnitude of the substantially constant current is generally dictated by parameters external to circuit 10. In conventional manner, the predetermined value is determined by selecting a transistor 22 of predetermined size and characteristics, applying $V_{DD}$ to the source, and applying a predetermined $V_{REF}$ as a fixed bias. Transistor 22 operates in its saturation region. That is, the current through transistor 22 is limited to some predetermined value less than the current when transistor 22 is completely turned on.

Transistors 18 and 24 are in opposite states of conduction, and transistor 18 determines the states. That is, when transistor 18 is on, transistor 24 is off; and when transistor 18 is off, transistor 24 is on. In particular, when transistor 18 is turned on, the substantially constant current from transistor 22 flows through transistor 18 to ground. Node 20 thereby goes low and turns off transistor 24. In contrast, when transistor 18 is turned off, the substantially constant current from transistor 22 charges node 20 to a relatively high value thereby turning on transistor 24 which provides a path for the substantially constant current to output terminal 11. Thus, the conduction state of transistor 18 determines whether the substantially constant current is coupled to the output terminal 11 as $I_{OUT}$ through output transistor 24, or is coupled to ground through ground path transistor 18.

As discussed with reference to the prior art, when the gate of transistor 18 goes high, transistor 18 turns on and operates in the linear region. That is, transistor 18 is completely turned on. Therefore, transistor 18 rapidly discharges any capacitance at node 20. As a result, transistor 24 and the substantially constant current to $I_{OUT}$ turn off rapidly as the current is switched to ground through transistor 18. However, when the gate of transistor 18 goes low, the capacitance at node 20 is charged by transistor 22 which operates in its saturation region. Therefore, the current provided by transistor 22 is relatively small, resulting in a relatively slow charging of node 20. Furthermore, transistor 24 will not begin to conduct until node 20 reaches approximately 1 volt above $V_{BIAS}$. For example, if $V_{BIAS}$ is 1.7 volts, transistor 24 will not conduct until node 20 reaches approximately 2.7 volts. Thus, the propagation delay from the gate of transistor 18 going low until the output current is turned on is larger than the propagation delay from the gate of transistor 18 going high until the output current is turned off. Stated differently, the propagation delays between rising and falling edges of transitions at the gate of transistor 18 and their respective current output transitions are not equal.

In accordance with the invention, transistors 12 and 16 are included in circuit 10. Transistor 16 is connected to $V_{REF}$ and $V_{DD}$ in the same manner as transistor 22, and is configured as a current source to slowly drive node 14 in a manner that mimics the slow charging of node 20 by transistor 22. In particular, transistor 16 operates in its saturation or current limited region. Transistor 12 is connected to discharge node 14 rapidly in a manner similar to the rapid discharging of node 20 by transistor 18. In particular, transistor 12 operates in its linear region.

A binary or digital input signal which is to be converted by itself or in combination with other digits or bits to an analog signal is applied to the gate of transistor 12. In particular, the binary signal is an input voltage that has two possible states or characteristics. One characteristic is a logical "1", while the other characteristic is a logical "0". For example, one state may be +5 volts while the other may be 0 volts. As here configured, a high voltage turns transistor 12 on, and a low voltage turns transistor 12 off. Similar to the discussion with reference to transistor 18, when the binary signal goes high, transistor 12 turns on and, with very little delay, discharges node 14. That is, node 14 is driven low very rapidly after the binary signal on the gate of transistor 12 goes high. Node 14 is connected to the gate of transistor 18, and its voltage determines the conduction state of transistor 18. Thus, as transistor 12 turns on, transistor 18 turns off. As can be seen, there is one relatively fast and one relatively slow propagation delay between the binary signal going high and the current being switched on through transistor 24.

When the binary signal goes low, transistor 12 turns off. Like transistor 22, transistor 16 operates in its saturation region and, with limited current supplied, charges node 14 relatively slowly. Thus, there is a relatively long propagation delay between the binary signal going low and node 14 being charged sufficiently to turn on transistor 18. However, once transistor 18 does turn on, it rapidly discharges node 20 to turn off transistor 24 and switch off the current to output terminal 11. Therefore, in this other transition of the binary signal going from a high to a low, there is also one relatively fast and one relatively slow propagation delay between the binary signal transition and the corresponding turning off of the output current.

Figure 2:
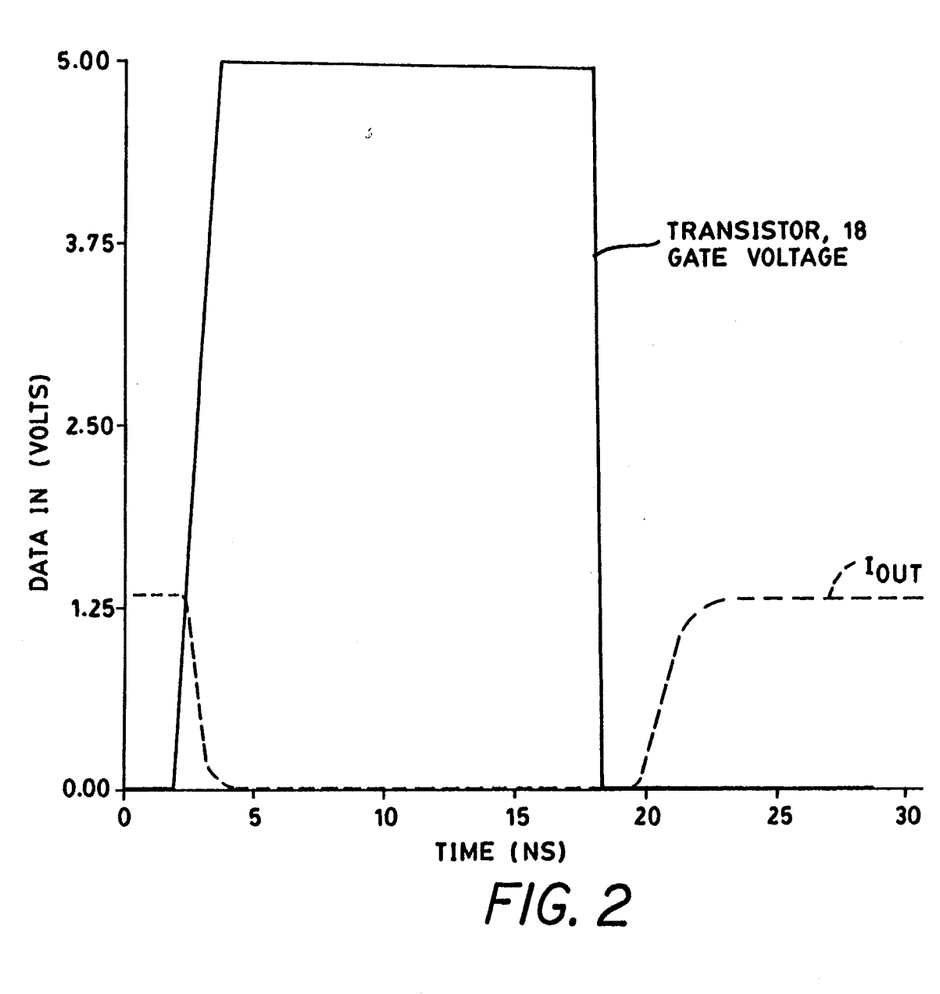
FIG. 2 is a simulation plot showing the output current $I_{OUT}$ in response to a switching signal applied to the gate of transistor 18.

Referring to FIG. 2, a simulated plot shows the relationship between a gate voltage applied to transistor 18 and the resulting current $I_{OUT}$ at output terminal 11. In particular, when the gate voltage goes through a transition from low-to-high, the current $I_{OUT}$ rapidly turns off with very little propagation delay. However, when the gate voltage goes through a transition from high-to-low, there is a relatively long propagation delay before the current $I_{OUT}$ turns on. For the example given, the propagation delay for a low-to-high transition is almost instantaneous while the propagation delay for a high-to-low transition is several nanoseconds. For example, the midpoint of the falling edge of the transistor 18 gate voltage occurs at approximately 17 nanoseconds while the midpoint of the rising edge of $I_{OUT}$ occurs at approximately 20 nanoseconds. As can be seen, if a binary signal embodied as a square-wave pulse train were input to the gate of transistor 18, anomalous timing would result on $I_{OUT}$. That is, the current would not be a square-wave, but rather would be a waveform having a duty cycle of less than 50%. The current would be turned off more than on because there would be a larger propagation delay in turning on. If signals of this type are summed to produce analog waveforms, the resulting signal would have a large harmonic distortion content relative to waveforms produced by the present invention.

Figure 3:
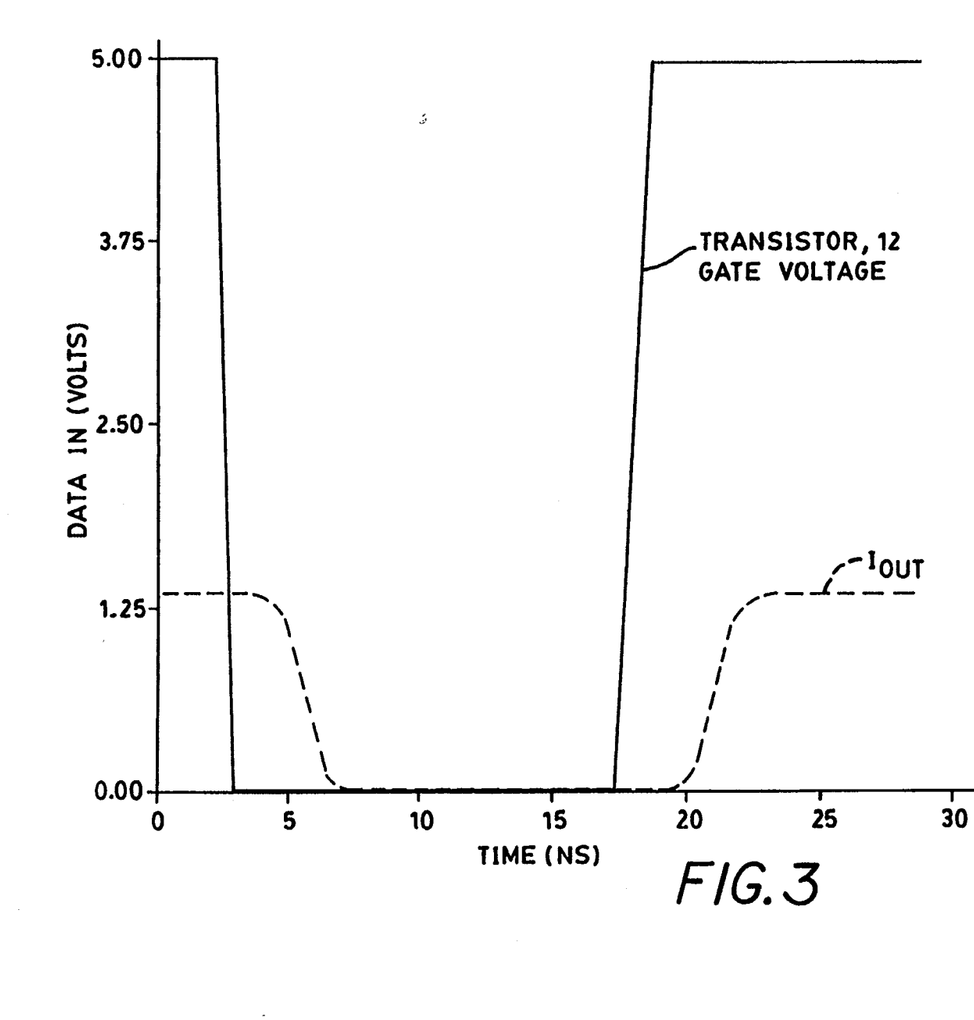
FIG. 3 is a simulation plot showing the output current $I_{OUT}$ in response to a binary input signal.

In accordance with the invention, FIG. 3 shows the respective propagation delays from the binary input signal transitions at the gate of transistor 12. That is, it shows the improvement of adding transistors 12 and 16 to circuit 10. It is first noted that the input waveform is inverted because transistor 12 adds one additional inversion. As shown, the turning on of current in this example occurs at approximately the same time, here approximately at 20 nanoseconds, as the turning on in FIG. 2 when a voltage transition is applied to the gate of transistor 18. This follows because only a propagation delay for transistor 12 turning on has been added, and this delay is extremely small. However, the turning off of current is delayed several nanoseconds to approximately 5 nanoseconds because an additional relatively long propagation delay has been added by transistor 12 turning off and current from transistor 16 slowly charging node 14. Generally, with the addition of transistors 12 and 16, the propagation delays between binary signal transitions from high-to-low and from low-to-high are approximately equal because each comprises one fast and one slow propagation delay between there and the corresponding switching on or switching off of current through transistor 24. As a result, the timing of the output current $I_{OUT}$ closely represents the binary input signal. A square-wave input results in a square-wave output. Thus, a source of harmonic distortion is eliminated, or at least substantially reduced. Simply stated, circuit 10 generates an analog wave form with precision timing relative to the binary or digital input; there are propagation delays, but they are equal for both high-to-low and low-to-high transitions. Although delayed, the output analog waveform accurately represents the timing of the input binary signal.

Circuit 10 further reduces harmonic distortion by providing output waveforms with substantially equal rise and fall times. More specifically, rise and fall times are generally defined as the times for the output voltages to swing between 10% and 90% of full scale or vice versa, and relates to slew rate. Here, the output rise and fall times are dependent on the rate at which transistor 24 switches from off to on, and vice versa. These switching rates are in turn dependent on the slew rate of node 20 as it passes through the critical point where transistor 24 changes its state. Without the use of transistors 12 and 16, the slew rate of node 20 is steeper on a falling edge than on a rising edge. Therefore, the waveform of $I_{OUT}$ would have relatively quick fall times and relatively slow rise times. This would contribute to harmonic distortion. In accordance with the invention, the output rise and fall times are substantially equalized by the addition of node 14 with a relatively slow rise time. Since the gate of transistor 18 is driven high by a relatively slow signal, the falling edge at node 20 is less steep than it would be otherwise. By a proper selection of component values, the rise and fall times can be equalized, thus eliminating or at least reducing this cause of harmonic distortion. In summary, the addition of node 14 with a relatively slow rise time slows down the turning on of transistor 18 thereby slowing down the falling edge of node 20 to be substantially equal to the relatively slow rising edge.

Figure 4:
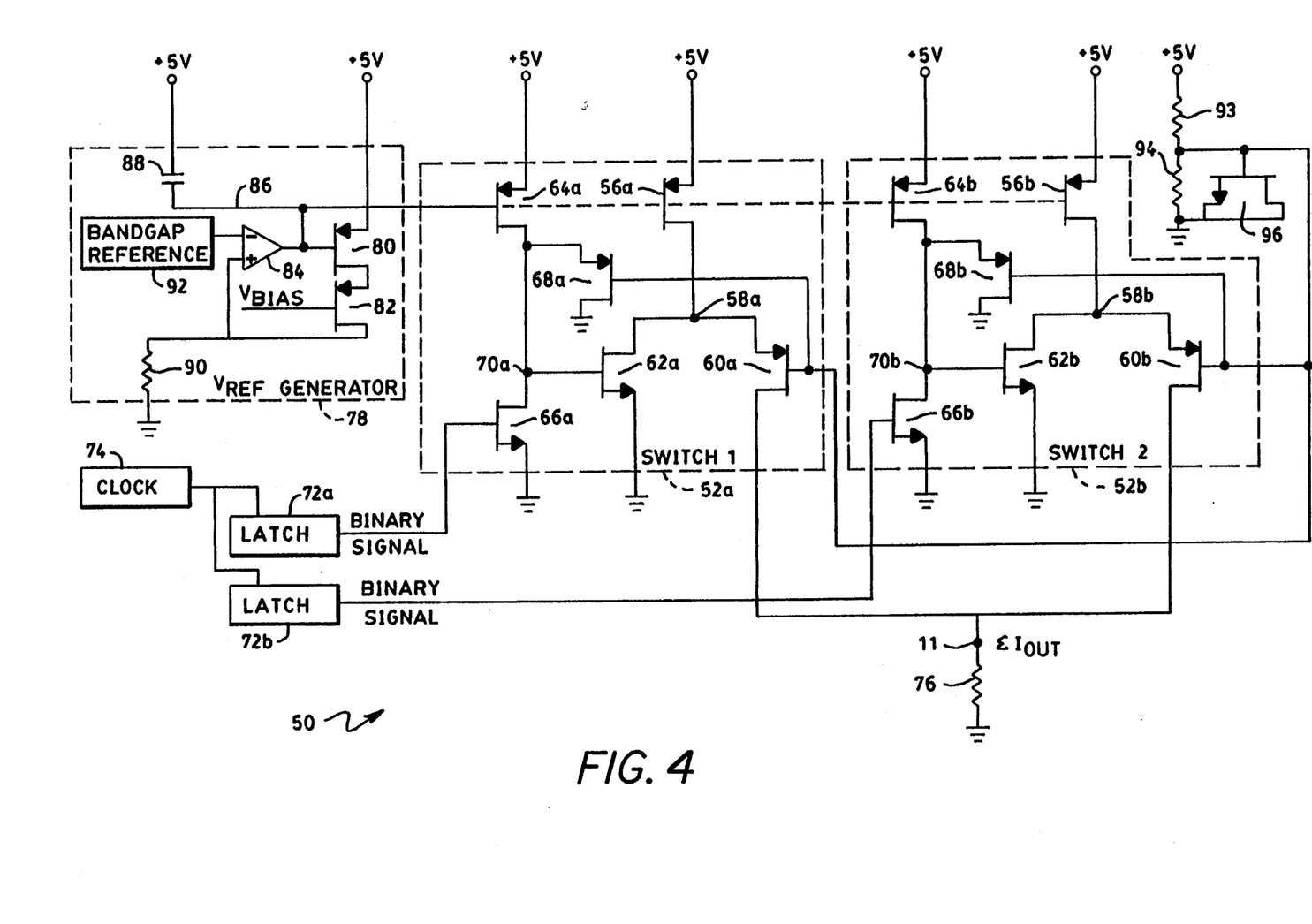
FIG. 4 is a simplified circuit showing an implementation of a plurality of switch circuits.

Referring to FIG. 4, a circuit 50 includes the implementation of a plurality, here two, of switch circuits 52a and b that are similar to switch circuit 10. More specifically, transistors 56a and b correspond to transistor 22 in that they provide a substantially constant current to nodes 58a and b that correspond to node 20. Transistors 60a and b correspond to output transistor 24. Transistors 62a and b correspond to ground path transistor 18. Further, transistors 64a and b correspond to transistor 16, and transistors 66a and b correspond to transistor 12. In addition to the above described transistors, switch circuits 52a and b also have respective transistors 68a and b, here p-types, with sources connected to nodes 70a and b, drains connected to ground, and gates connected to the respective gates of transistors 60a and b.

In operation, transistors 68a and b clamp respective nodes 70a and b so that the current through respective transistors 64a and b never turns off. In particular, without transistors 68a and b, nodes 70a and b would rise to +5 volts and the current through respective transistors 64a and b would turn off. This could result in a +5 volt supply that would be data dependent. However, with the addition of transistors 68a and b, an alternate path is provided for the current through respective transistors 64a and b. That is, taking switch circuit 52a as an example, transistors 64a, 66a and 68a mimic the operation of transistors 56a, 62a and 60a to provide alternate paths for the substantially constant current. Therefore, the current through transistors 64a and b, like the current through transistors 56a and b, never turns off.

The binary or digital input signal for each switch circuit 52a and b is held in a respective latch 72a and b to provide precision timing regardless of the skew in incoming data. That is, the timing of binary signals from latches 72a and b to respective switches 52a and b is determined by clock 74. As shown, the outputs of switch circuits 52a and b from respective drains of output transistors 60a and b are tied together to provide a sum of output currents $I_{OUT}$. As is conventional, the currents through transistors 56a and b may be equally weighted, and latches 70a and b may be fed by a decoder (not shown) to provide a sum of output currents that is representative of an input digital word. Alternatively, the sizes of the respective current providing transistors 56a and b may be selected to provide substantially constant currents that are binary weighted according to respective bit positions of bits stored in respective latches 70a and b. In either case, the sum of currents from the outputs of switch circuits 52a and b typically represents an input digital word that commonly would have many bits. The summed output current is here shown fed to a resistor 76 to provide the analog voltage at output terminal 11.

The substantially constant reference voltage applied to the gates of transistors 64a and b and 56a and b is here provided by $V_{REF}$ generator 78. MOS transistor 80, here a p-type, has a source connected to +5 volts and a drain connected to the source of MOS transistor 82, here a p-type. The output from operational amplifier 84 is coupled to the gate of transistor 80, and also to line 86 that is coupled to the gate of transistors 64a and b and 56a and b to supply $V_{REF}$. Line 86 is also coupled through capacitor 88 to +5 volts. $V_{BIAS}$ is coupled to the gate of transistor 82. The drain of transistor 82 is fed back to the positive input of operational amplifier 84, and also connected through resistor 90 to ground. Bandgap reference 92 is connected to the negative input of operational amplifier 84.

In operation, operational amplifier 84 drives the gate of transistor 80 to produce a current through transistors 80 and 82 that equalizes the inputs to operational amplifier 84. In particular, bandgap reference 92 supplies a fixed voltage to the negative input of operational amplifier 84, and the current through resistor 90 is forced to a substantially constant level that provides the same fixed voltage drop across resistor 90. In this manner, the inputs to operational amplifier 84 are equalized. The gate voltage on transistor 80 that provides the substantially constant current through transistor 80 is fed to the respective gates of transistors 64a and b and 56a and b as $V_{REF}$.

$V_{BIAS}$ is here provided by voltage divider resistors 93 and 94 connected between +5 volts and ground with a center tap connected to the gate of MOS transistor 96, here an n-type. The drain and source of transistor 96 are connected to ground. The gate of transistor 96 is also connected to the gates of transistors 60a and b and to transistor 82 to provide $V_{BIAS}$ which may, for example, be 1.7 volts.

This concludes the description of the preferred embodiment. A reading of it by one skilled in the art will bring to mind many alterations and modifications that do not depart from the spirit and scope of the invention. Therefore, it is intended that the scope of the invention be limited only by the appended claims.

What is claimed is:

1. A circuit for providing an output current having characteristics indicating a binary input voltage having a first characteristic representing a binary "1" and a second characteristic representing a binary "0", comprising:

means for generating a substantially constant current;
   switching means responsive to a switching signal for either feeding said substantially constant current as output current to an output terminal or diverting said substantially constant current in accordance with said switching signal, said switching means having a first propagation delay for switching on current to said output terminal and a second propagation delay for switching off current to said output terminal, said first and second propagation delays being unequal; and
   means responsive to said binary input voltage for providing said switching signal to said switching means, said providing means having unequal propagation delays for a binary input voltage transition from a "1" to a "0" than for a transition from a "0" to a "1" to compensate for said first and second propagation delays of said switching means being unequal wherein a propagation delay from a first one of said binary input voltage transitions to a corresponding switching on or switching off of said substantially constant current to said output terminal of said switching means is substantially equal to a propagation delay from the opposite one of said binary input voltage transitions to a corresponding switching on or switching off of said substantially constant current to said output terminal of said switching means.

2. The circuit recited in claim 1 wherein said substantially constant current generating means comprises an MOS transistor having a predetermined energizing voltage and a gate coupled to a substantially constant reference voltage.

3. The circuit recited in claim 2 wherein said switching means comprises first and second MOS transistors connected to a common node with said transistor generating said substantially constant current, said first transistor being coupled between said node and ground and having said switching signal applied to its gate, said second transistor being coupled between said node and said output terminal, said first and second transistors being in opposite states of conduction with the conduction state of said first transistor being determined by said switching signal wherein said substantially constant current is directed either through said second transistor to said output terminal or through said first transistor to ground in accordance with said switching signal.

4. The circuit recited in claim 3 wherein said switching signal providing means comprises fourth and fifth MOS transistors wherein said fourth transistor has the same energizing voltage and gate voltage as said transistor generating said substantially constant current to generate a second current fed to a second node, and said fifth transistor is coupled between said second node and ground, said fifth transistor having a gate fed by said binary input voltage.

5. The circuit recited in claim 4 wherein said second node is coupled to said gate of said first transistor to provide said switching signal.

6. The circuit recited in claim 5 wherein said switching signal providing means has a third propagation delay between said first one of said binary input voltage transitions and a corresponding transition of said switching signal, and a fourth propagation delay between said opposite one of said binary input voltage transitions and a corresponding transition of said switching signal, said third and fourth propagation delays being unequal.

7. The circuit recited in claim 6 wherein said first and fourth propagation delays are substantially equal and said second and third propagation delays are substantially equal.

8. The circuit recited in claim 7 where said propagation delay between said first one of said binary input voltage transitions and the corresponding switching on or switching off of said substantially constant current to said output terminal of said switching means is the sum of said first and third propagation delays, and said propagation delay between said opposite one of said binary input voltage transitions to a corresponding switching on or switching off of said substantially constant current to said output terminal of said switching means is the sum of said second and fourth propagation delays.

9. The circuit recited in claim 8 wherein said first and fifth transistors are n-type operated in their linear regions.

10. The circuit recited in claim 8 wherein said constant current generating transistor and said fourth transistor are both p-type operated in their saturation regions.

11. A circuit for providing an output current having characteristics indicating a binary input voltage having a first characteristic representing a binary "1" and a second characteristic representing a binary "0", comprising:

a first MOS transistor of a p-type or n-type, the first transistor having a conductivity state responsive to the binary input voltage, the first MOS transistor being conductive in response to a particular one of the first and second characteristics and being non-conductive in response to the other one of the first and second characteristics;

a second MOS transistor of a p-type or n-type opposite from the first transistor, the second transistor having a conductivity state responsive to the conductivity state of said first MOS transistor, the second MOS transistor being non-conductive upon a state of conductivity in the first MOS transistor and being conductive upon a state of nonconductivity in the first MOS transistor;

means operatively coupled to the first and second MOS transistors for providing for a substantially constant flow of current through the second MOS transistor and no current flow through the first transistor during a state of conductivity in the second transistor, and for providing for the flow of the substantially constant current through the first MOS transistor and no flow of current through the second MOS transistor during the state of conductivity in the first MOS transistor to obtain the output current from the second transistor in representation of the binary input signal; and equalizing means for providing substantially equal propagation delays between transitions of the binary input voltage and corresponding switching on and switching off of the substantially constant current through the second transistor, the transitions being from the first characteristic to the second characteristic and from the second characteristic to the first characteristic.

12. The circuit recited in claim 11 wherein said equalizing means comprises means for providing substantially equal rise and fall times of the output current from the second transistor.

13. The circuit recited in claim 11 wherein the first transistor is an n-type and the second transistor is a p-type.

14. The circuit recited in claim 11 wherein the substantially constant current providing means comprises an MOS transistor having a predetermined reference voltage coupled to a gate and a predetermined energizing voltage wherein the constant current providing transistor operates in a saturation region.

15. The circuit recited in claim 14 wherein the first transistor operates in a linear region.

16. The circuit recited in claim 11 wherein there is a first propagation delay between a high level signal being applied to a gate of the first transistor and current through the second transistor being switched off, and an unequal second propagation delay between a low level signal being applied to the gate of the first transistor and the current through the second transistor being switched on, the equalizing means comprising means coupled between the binary input voltage and the gate of the first transistor for introducing propagation delays which, when added to the respective first and second propagation delays, provides equal propagation delays between binary input voltage transitions and current through the second transistor being switched on or off, regardless of whether the binary input voltage transitions are from the first characteristic to the second characteristic or from the second characteristic to the first characteristic.

17. The circuit recited in claim 16 wherein the equalizing means comprises fourth and fifth MOS transistors wherein the fourth transistor has the same energizing voltage and gate voltage as the transistor generating said substantially constant current to generate a second current, and the fifth transistor is coupled between the fourth transistor and ground, the fifth transistor having a gate fed by said binary input voltage with the gate of the first transistor being fed by a node between the fourth and fifth transistors.

18. A circuit for providing an output current having characteristics indicating a binary input signal having a first characteristic representing a binary "1" and a second characteristic representing a binary "0", comprising:

a first MOS transistor of an n-type having a source connected to ground;

a second MOS transistor of a p-type having a drain connected to an output terminal;

means for providing a bias voltage to a gate of the second transistor;

a third MOS transistor of a p-type having a drain connected to a common node with a drain of the first transistor and a source of the second transistor;

means for providing a predetermined energizing voltage to a source of the third transistor;

means for providing a predetermined substantially constant reference voltage to a gate of the third transistor to cause a substantially constant current to flow from the third transistor to the node;

the first and second transistors being in opposite states of conduction with the states being determined by a switching signal applied to a gate of the first transistor wherein, when a high level signal is applied, the substantially constant current flows from the node through the first transistor to ground with no current flowing through the second transistor and, when a low level signal is applied, the substantially constant current flows from the node through the second transistor to the output terminal with no current flowing through the first transistor, the substantially constant current being switched on through the second transistor after a first propagation delay from the switching signal on the first transistor going low and being switched off after a second propagation delay from the switching signal on the first transistor going high wherein the first propagation delay is relatively long compared with the second propagation delay;

a fourth MOS transistor of a p-type having a source connected to the same predetermined energizing voltage as the third transistor;

the fourth transistor having a gate connected to the 41 same substantially constant reference voltage as the gate of the third transistor to provide a predetermined current from the drain of the fourth transistor to a second node; and a fifth MOS transistor of an n-type having a drain connected to the second node and a source connected to ground, the binary input voltage being fed to a gate of the fifth transistor to determine the state of conduction of the fifth transistor wherein the second node is connected to the gate of the first transistor to provide the switching signal, the fourth and fifth transistors providing propagation delays for respective binary input voltage transitions that compensate for the inequality of the first and second propagation delays wherein each binary input voltage transition is followed by one relatively long and one relatively short propagation delay between the gate of the fifth transistor and the substantially constant current being switched either on or off through the second transistor to the output terminal.

* * * * *